United States Patent
Glenn et al.

(10) Patent No.: US 6,580,167 B1
(45) Date of Patent: Jun. 17, 2003

(54) HEAT SPREADER WITH SPRING IC PACKAGE

(75) Inventors: Thomas P. Glenn, Gilbert, AZ (US); Steven Webster, Muntinlupa (PH); Roy Dale Hollaway, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/839,284

(22) Filed: Apr. 20, 2001

(51) Int. Cl.[7] ............................................... H01L 23/34
(52) U.S. Cl. .................. 257/718; 257/706; 257/707; 257/712; 257/713; 257/719
(58) Field of Search ................................. 257/706, 707, 257/712, 713, 718, 719

(56) References Cited

U.S. PATENT DOCUMENTS

| | | | |
|---|---|---|---|
| 5,166,772 A | 11/1992 | Soldner et al. | 257/659 |
| 5,328,870 A | 7/1994 | Marrs | 437/216 |
| 5,357,404 A * | 10/1994 | Bright et al. | 174/35 R |
| 5,504,652 A | 4/1996 | Foster et al. | 361/704 |
| 5,542,468 A * | 8/1996 | Lin | 165/185 |
| 5,600,540 A * | 2/1997 | Blomquist | 174/16.3 |
| 5,609,889 A | 3/1997 | Weber | 425/116 |
| 5,766,535 A | 6/1998 | Ong | 264/272.15 |
| 5,822,848 A * | 10/1998 | Chiang | 257/675 |
| 5,930,114 A * | 7/1999 | Kuzmin et al. | 165/80.2 |
| 6,049,469 A | 4/2000 | Hood, III et al. | 361/818 |
| 6,181,006 B1 * | 1/2001 | Ahl et al. | 257/712 |
| 6,373,703 B2 * | 4/2002 | Johnson et al. | 174/16.3 |
| 6,377,463 B1 * | 4/2002 | Shah | 165/185 |

* cited by examiner

*Primary Examiner*—Richard Elms
*Assistant Examiner*—Doug Menz
(74) *Attorney, Agent, or Firm*—Gunnison, McKay & Hodgson, L.L.P.; Serge J. Hodgson

(57) ABSTRACT

An RF shielded package includes a heat sink having a plurality of spring elements. The spring elements press the heat sink against a mold half during encapsulation to prevent encapsulant from leaking between the heat sink and the mold half. Further, the spring elements ground the heat sink to shield an electronic component from RF radiation.

26 Claims, 3 Drawing Sheets

HEAT SPREADER WITH SPRING IC PACKAGE

BACKGROUND OF THE INVENTION

1. Field of the Invention

The present invention relates generally to the packaging of electronic components. More particularly, the present invention relates to an electronic component package having a heat transfer structure.

2. Description of the Related Art

As is well known to those skilled in the art, an electronic component such as an integrated circuit generated heat during operation. To prevent failure of the electronic component, it was important to prevent the electronic component from becoming overheated during operation.

To prevent the electronic component from becoming overheated, a heat sink was employed within the package, which housed the electronic component. In this manner, heat generated by the electronic component was transferred to the heat sink and dissipated to the ambient environment. This maintained the temperature of the electronic component at a suitable level.

To maximize the effectiveness of the heat sink, it was desirable to expose the heat sink directly to the ambient environment. Stated another way, it was desirable to prevent the heat sink from being enclosed within the molded plastic encapsulant. This was because the molded plastic encapsulant had a substantially lower heat transfer coefficient than the heat sink, e.g., copper, and thus impeded heat transfer from the heat sink to the ambient environment.

To prevent the heat sink from being enclosed within the molded plastic encapsulant, it was important that the mold half press firmly against the heat sink during encapsulation. In this manner, a tight seal was formed between the heat sink and the mold half to prevent the molded plastic encapsulant from leaking between the heat sink and the mold half. Molded plastic encapsulant, which leaks between the heat sink and the mold half, is commonly referred to as flash.

In the prior art, the heat sink was sandwiched between the mold half and leads of a lead frame. When the mold was closed, the leads were deflected slightly creating tensile force in the leads. This tensile force acted to press the heat sink tightly against the mold half thus preventing flash from forming around the heat sink.

Alternatively, in Weber, U.S. Pat. No. 5,609,889, the mold was provided with a bias plug that exerted pressure on the heat sink and prevented flash from forming around heat sink. The bias plug pressed the heat sink against a printed wiring board type substrate.

As set forth above, to prevent flash from forming around the heat sink, the heat sink was pressed against either leads of a lead frame or against a printed wiring board type substrate. However, these techniques only allowed the heat sink to remove heat from the lower surface, sometimes called the back-side surface, of the electronic component.

The heat sink could not be pressed against the upper surface, sometimes called the front-side surface, of the electronic component since the electronic component was relatively fragile and would be damaged or destroyed from the heat sink pressure. However, it is desirable to remove heat from the upper surface of the electronic component in certain applications.

SUMMARY OF THE INVENTION

In accordance with the present invention, an RF shielded package includes a heat sink having a plurality of spring elements. The spring elements serve several functions.

One function of the spring elements is to press the heat sink against the mold half during encapsulation to prevent the encapsulant, e.g., molded plastic encapsulant, from leaking between the heat sink and the mold half. This insures that an upper surface of the heat sink is exposed to the ambient environment and not covered by flash thus maximizing heat transfer from the RF shielded package.

Further, since the spring elements press against the substrate and not against the electronic component, the heat sink does not damage or destroy the electronic component. This allows the heat sink to be thermally connected directly to the upper surface of the electronic component.

Another function of the spring elements is to ground the heat sink. More particularly, the spring elements pressed directly on and are electrically connected to ground traces on an upper surface of the substrate. During use, the ground traces and thus the heat sink are electrically connected to a reference voltage source, e.g., ground. Accordingly, the heat sink forms a grounded shield above the electronic component and protects the electronic component from RF radiation.

These and other features and advantages of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
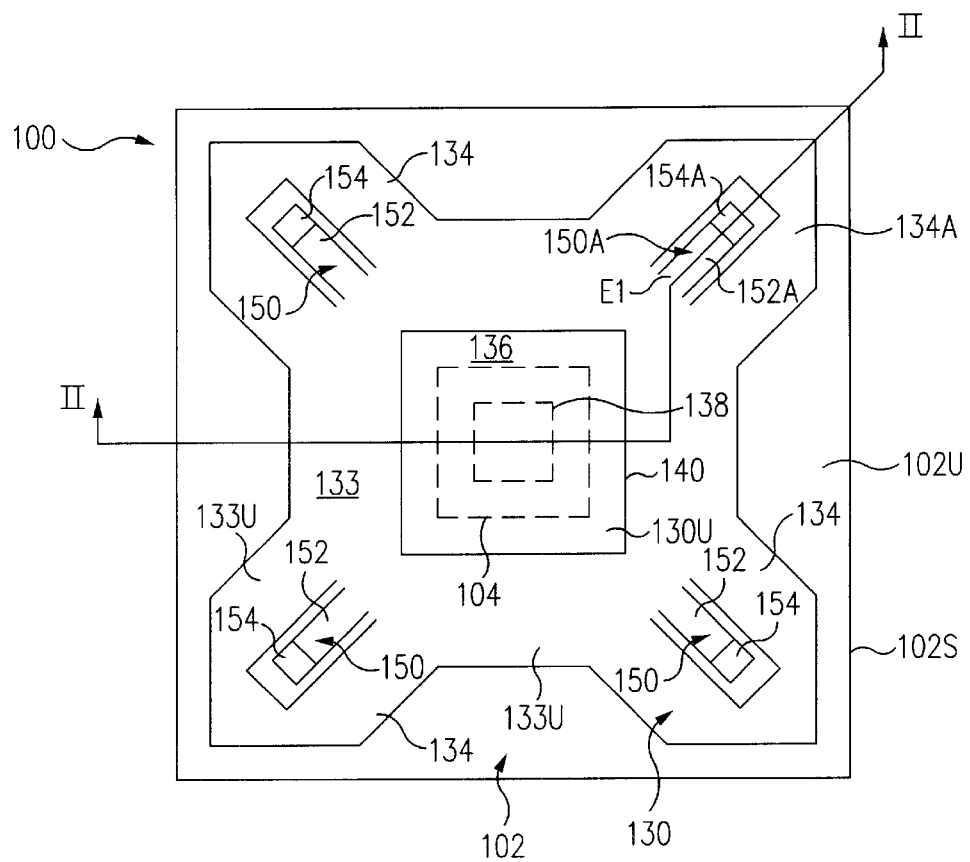
FIG. 1 is a top plan view of an RF shielded package in accordance with one embodiment of the present invention.

In accordance with the present invention, an RF shielded package 100 (FIGS. 1 and 2) includes a heat sink 130 having a plurality of spring elements 150. Spring elements 150 serve several functions.

One function of spring elements 150 is to press heat sink 130 against a mold half 306 (FIGS. 4 and 5) during encapsulation to prevent the encapsulant from leaking between heat sink 130 and mold half 306. This insures that an upper surface 130U of heat sink 130 is exposed to the ambient environment and not covered by flash thus maximizing heat transfer from RF shielded package 100.

Further, since spring elements press against substrate 102 and not against electronic component 104, heat sink 130 does not damage or destroy electronic component 104. This allows heat sink 130 to be thermally connected directly to an upper surface 104U of electronic component 104.

Referring again to FIGS. 1 and 2 together, another function of spring elements 150 is to ground heat sink 130. More particularly, spring elements 150 pressed directly on and are electrically connected to upper ground traces 110G on an upper surface 102U of substrate 102. During use, upper ground traces 110G and thus heat sink 130 are electrically connected to a reference voltage source, e.g., ground. Accordingly, heat sink 130 forms a grounded shield above electronic component 104 and protects electronic component 104 from RF radiation.

Figure 2:
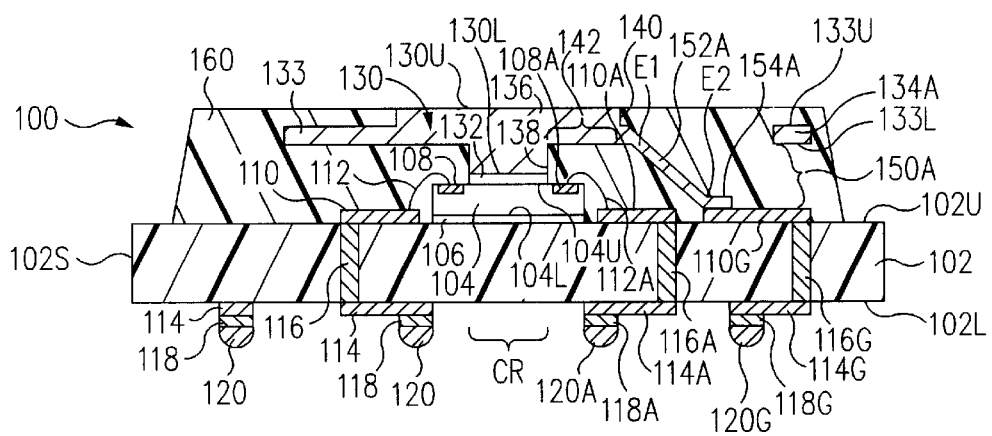
FIG. 2 is a cross-sectional view of the RF shielded package along the line II—II of FIG. 1.

More particularly, FIG. 1 is a top plan view of an RF shielded package 100 in accordance with one embodiment of the present invention. FIG. 2 is a cross-sectional view of package 100 along the line II—II of FIG. 1. Referring now to FIGS. 1 and 2 together, package 100 includes a substrate 102 such as a printed circuit board, ceramic or tape although other materials are used in other embodiments. Substrate 102 includes an upper, e.g., first, surface 102U and a lower, e.g., second, surface 102L.

An electronic component 104 such as an integrated circuit is mounted to upper surface 102U with, for example, adhesive 106. More particularly, a lower, e.g., first, surface 104L of electronic component 104 is mounted to upper surface 102U of substrate 102. An upper, e.g., second, surface 104U of electronic component 104 has formed thereon bond pads 108 including a first bond pad 108A. Bond pads 108 are electrically connected to the various internal circuitry of electronic component 104 (not shown).

Formed on upper surface 102U of substrate 102 are a plurality of electrically conductive upper traces 110 including a first upper trace 110A. Bond pads 108 are electrically connected to upper traces 110 by electrically conductive bond wires 112. To illustrate, bond pad 108A is electrically connected to upper trace 110A by a first bond wire 112A of the plurality of bond wires 112. The other bond pads 108 are electrically connected to the other upper traces 110 by the other bond wires 112 in a similar manner so are not discussed further to avoid detracting from the principals of the invention.

Formed on lower surface 102L of substrate 102 are a plurality of electrically conductive lower traces 114 including a first lower trace 114A. Upper traces 110 are electrically connected to lower traces 114 by electrically conductive vias 116 extending through substrate 102 from upper surface 102U to lower surface 102L. To illustrate, upper trace 110A is electrically connected to lower trace 114A by a first via 116A of the plurality of vias 116. The other upper traces 110 are electrically connected to the other lower traces 114 by the other vias 116 in a similar manner so are not discussed further to avoid detracting from the principals of the invention.

Formed on lower traces 114 are electrically conductive pads 118. To illustrate, a first pad 118A of the plurality of pads 118 is formed on and electrically connected to lower trace 114A. Formed on and electrically connected to pads 118 are electrically conductive interconnection balls 120, e.g., solder. To illustrate, a first interconnection ball 120A of the plurality of interconnection balls 120 is formed on interconnection pad 118A.

As set forth above, an electrically conductive pathway between bond pad 108A and interconnection ball 120A is formed by bond wire 112A, upper trace 110A, via 116A, lower trace 114A and pad 118A. The other bond pads 108, bond wires 112, upper traces 110, vias 116, lower traces 114, pads 118 and interconnection balls 120 are electrically connected to one another in a similar fashion so are not discussed further to avoid detracting from the principals of the invention.

Also formed on upper surface 102U of substrate 102 is an electrically conductive upper ground trace 110G. Formed on lower surface 102L of substrate 102 is an electrically conductive lower ground trace 114G. Upper ground trace 110G is electrically connected to lower ground trace 114G by an electrically conductive ground via 116G extending through substrate 102 from upper surface 102U to lower surface 102L.

Formed on lower ground trace 114G is an electrically conductive ground pad 118G. Formed on and electrically connected to ground pad 118G is an electrically conductive ground interconnection ball 120G, e.g., solder.

As set forth above, an electrically conductive pathway between upper ground trace 110G and ground interconnection ball 120G is formed by ground via 116G, lower ground trace 114G and ground pad 118G. Generally, package 100 includes at least one upper ground trace 110G, ground via 116G, lower ground trace 114G, ground pad 118G and ground interconnection ball 120G. The other upper ground traces 110G, ground vias 116G, lower ground traces 114G, ground pads 118G and ground interconnection balls 120G, if any, are electrically connected to one another in a similar fashion so are not discussed further to avoid detracting from the principals of the invention.

Although particular electrically conductive pathways between bond pad 108A, upper ground trace 110G and interconnection ball 120A, ground interconnection ball 120G, respectively, are described above, in light of this disclosure, it is understood that other electrically conductive pathways can be formed. For example, substrate 102 is a multi-layered laminated substrate and, instead of straight-through vias 116, 116G, a plurality of electrically conductive traces on various layers in substrate 102 are interconnected by a plurality of electrically conductive vias to form the electrical interconnections between traces 110A, 110G and 114A, 114G, respectively.

As a further example, vias 116, 116G extend along side 102S of substrate 102 and traces 110A, 110G and 114A, 114G extend to side 102S. As another alternative, interconnection balls 120, 120G are distributed in an array format to form a ball grid array (BGA) package. Alternatively, interconnection balls 120, 120G are not formed, e.g., to form a metal land grid array (LGA) package or a leadless chip carrier (LCC) package. In another alternative, pads 118, 118G are not formed and interconnection balls 120, 120G are formed directly on lower traces 114, 114G, respectively. Other electrically conductive pathway modifications will be obvious to those of skill in the art.

Thermally connected to upper surface 104U of electronic component 104 is an RF shield and heat sink 130, hereinafter referred to as heat sink 130. In this embodiment, a thermal pad 132 is located between upper surface 104U and heat sink 130. Thermal pad 132 is compliant thus compensating for any mismatch between heat sink 130 and electronic component 104. Thermal pads are well known to those of skill in the art and are not discussed further to avoid detracting from the principals of the invention.

In an alternative embodiment, package 100 is formed without thermal pad 132. In accordance with this embodiment, heat sink 130 directly contacts upper surface 104U of electronic component 104. In yet another alternative embodiment, package 100 is formed without thermal pad 132 and a gap exists between heat sink 130 and upper surface 104U of electronic component 104. This gap is filled with encapsulant during the encapsulation process described below. Alternatively, this gap is a void between heat sink 130 and upper surface 104U of electronic component 104.

Referring again to the embodiment illustrated in FIGS. 1 and 2, a lower, e.g., first, surface 130L of heat sink 130 is thermally connected to upper surface 104U of electronic component 104. More particularly, lower surface 130L contacts a central region CR of upper surface 104U of electronic component 104 inward of bond pads 108. Stated another way, lower surface 130L has a surface area less than a surface area of upper surface 104U such that bond pads 108 are exposed.

Heat sink 130 further includes an upper, e.g., second, surface 130U. In accordance with this embodiment, upper surface 130U is exposed directly to the ambient environment.

During use, electronic component 104 generates heat. This heat is transferred to heat sink 130 primarily through lower surface 130L. Heat sink 130 dissipates this heat to the ambient environment primarily through upper surface 130U. In this manner, the temperature of electronic component 104 is maintained below the maximum operating temperature of electronic component 104.

In this embodiment, upper surface 130U of heat sink 130 has a greater surface area than the surface area of upper surface 104U of electronic component 104. Advantageously, by maximizing the surface area of upper surface 130U, heat transfer from heat sink 130 to the ambient environment is also maximized. However, in alternative embodiments, the surface area of upper surface 130U of heat sink 130 is equal to or less than the surface area of upper surface 104U of electronic component 104. It is understood that heat sink 130 can be formed in a variety of shapes and include a variety of features, e.g., such as fins.

In this embodiment, upper surface 130U and lower surface 130L of heat sink 130 are parallel to one another. A central body portion 136 of heat sink 130 is defined by upper surface 130U and lower surface 130L of heat sink 130. Central body portion 136 is further defined by a lower, e.g., first, side 138 and an upper, e.g., second, side 140. Sides 138, 140 are perpendicular to upper surface 130U and lower surface 130L. Although the terms parallel and perpendicular are used herein with regards to the orientation of various items, in light of this disclosure, is understood that the various items are only substantially parallel and perpendicular to within accepted manufacturing tolerances.

Lower side 138 extends between lower surface 130L and a ledge 142 of central body portion 136. Ledge 142 extends outwards from central body portion 136. Ledge 142 is perpendicular to lower side 138 and parallel to upper surface 130U and lower surface 130L.

Ledge 142 extends horizontally, sometimes referred to as laterally, between lower side 138 and upper side 140 and over bond pads 108. Lower side 138 and ledge 142 form an overhang above bond wires 112 and provide clearance for bond wires 112 between upper surface 104U of electronic component 104 and ledge 142.

Heat sink 130 further includes a projection ring 133 including four projections 134 projecting outwards from central body portion 136 of heat sink 130. In accordance with this embodiment, projection ring 133 including projections 134 is parallel to upper surface 130U and lower surface 130L of heat sink 130. Further, projection ring 133 including projections 134 is located between planes defined by upper surface 130U and lower surface 130L of heat sink 130.

In this embodiment, an upper, e.g., first, surface 133U of projection ring 133 including projections 134 is connected to and extends from upper side 140. A lower, e.g., second, surface 133L of projection ring 133 including projections 134 is coplanar with and forms an extension of ledge 142.

Projections 134 support spring elements 150. More particularly, spring elements 150 are cut from projections 134, e.g., by stamping. Spring elements 150 include legs 152 and feet 154. To illustrate, a first spring element 150A of the plurality of spring elements 150 includes a first leg 152A of the plurality of legs 152 and a first foot 154A of the plurality of feet 154. A first end E1 of leg 152A is connected to a first projection 134A of the plurality of projections 134. A second end E2 of leg 152A is connected to foot 154A. The other spring elements 150 include legs 152 and feet 154 and are connected to the other projections 134 in a similar manner and so are not discussed further to avoid detracting from the principals of the invention.

Spring elements 150 support heat sink 130 on upper surface 102U of substrate 102. Spring elements 150 are made of a flexible resilient material. For example, spring elements 150 are made of copper, stainless steel, a metal alloy such as alloy 42, or anodized aluminum. In one embodiment, heat sink 130 is integral, i.e., is a single piece and not a plurality of separate pieces connected together. For example, a single piece of copper, stainless steel, a metal alloy such as alloy 42, anodized aluminum or other material having a high heat transfer coefficient is stamped and bent to make heat sink 130.

In one embodiment, heat sink 130 also functions as a shield to protect electronic component 104 from radiation. Examples of radiation of interest include electromagnetic radiation or radio frequency (RF) radiation. Stated another way, heat sink 130 shields electronic component 104 from interference such as electromagnetic interference (EMI) or radio frequency interference (RFI).

Generally, heat sink 130 is formed of an electrically conductive material. Advantageously, spring elements 150 serve several functions. One function of spring elements 150 is to ground heat sink 130.

To illustrate, referring now to spring element 150A, foot 154A is directly in contact with upper ground trace 110G. Accordingly, spring element 150A is electrically and physically connected to upper ground trace 110G. As set forth above, upper ground trace 110G is electrically connected to ground interconnection ball 120G. Accordingly, spring element 150A and, more generally, heat sink 130 is electrically connected to ground interconnection ball 120G.

During use, ground interconnection ball 120G is electrically connected to a reference voltage source, e.g., ground. Accordingly, heat sink 130 is electrically connected to the reference voltage source and held at a common potential, e.g., ground. Thus, heat sink 130 is a grounded shield above upper surface 104U of electronic component 104.

In an alternative embodiment, heat sink 130 is not connected to a reference voltage source, i.e., is electrically floating. For example, substrate 102 is formed without ground traces 110G. Accordingly, feet 154 of spring elements 150 contact upper surface 102U of substrate 102, which is an electrical insulator. In one embodiment, upper surface 102U and/or lower surface 102L include solder mask(s), which are electrical insulators, and feet 154 contact the solder mask on upper surface 102U. Although heat sink 130 is electrically floating, heat sink 130 still operates as a shield. More particularly, heat sink 130 is a floating shield above upper surface 104U of electronic component 104.

Advantageously, heat sink 130 shields electronic component 104 from external radiation and/or prevents electronic component 104 from emanating radiation to the ambient environment. More particularly, heat sink 130 shields upper surface 104U of electronic component 104, which is particularly sensitive to external radiation. Accordingly, package 100 is well suited for applications such as portable radio transmitters, portable telephones, portable radio receivers or other high frequency applications, which require shielding of electronic components.

In accordance with this embodiment, package 100 includes a package body 160. Package body 160 is not illustrated in FIG. 1 for purposes of clarity. Package body 160 is an electrically insulating material, for example, a molded plastic encapsulant or a liquid encapsulant as is well known to those of skill in the art. Package body 160 encloses and protects bond pads 108, bond wires 112, and traces 110, 110G.

Further, package body 160 protects and locks in place heat sink 130. Specifically, package body 160 is formed both above and below projection ring 133 including projections 134 thus preventing heat sink 130 from moving away from or towards substrate 102. By encasing projection ring 133 including projections 134 in package body 160, the reliability of package 100 is insured.

Advantageously, heat sink 130 is extremely effective at dissipating heat from upper surface 104U of electronic component 104 to the ambient environment. Further, heat sink 130 shields electronic component 104, which is important for high frequency applications.

Recall that in the prior art, heat transfer from the electronic component was primarily from the lower surface of the electronic component. Thus, the lower surface of the electronic component was not attached directly to a printed circuit board type substrate since this would impede heat transfer from the electronic component. Further, since the heat sink was located adjacent the lower surface of the electronic component, the upper surface of the electronic component was exposed to radiation. In stark contrast to the prior art, heat sink 130 in accordance with the present invention removes heat from upper surface 104U allowing lower surface 104L to be mounted to substrate 102, while at the same time, shields upper surface 104U.

Figure 3:
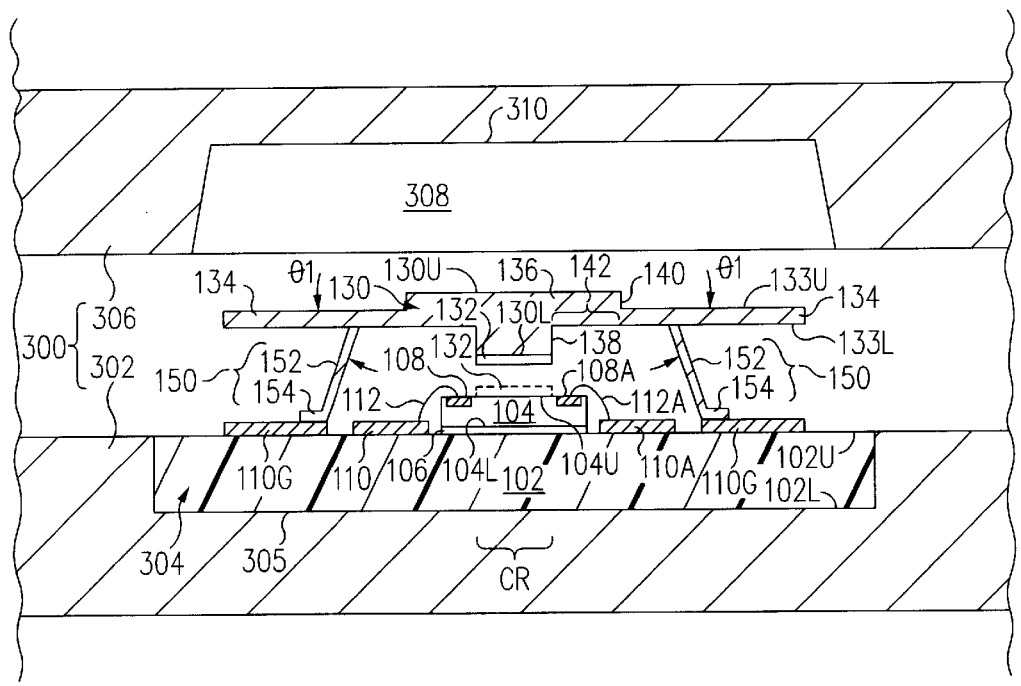
FIGS. 3, 4 and 5 are cross-sectional views of the RF shielded package of FIGS. 1 and 2 at various stages during fabrication in accordance with one embodiment of the present invention.

FIG. 3 is a cross-sectional view of package 100 during fabrication in accordance with one embodiment of the present invention. Referring now to FIG. 3, lower surface 104L of electronic component 104 is mounted to upper surface 102U of substrate 102, e.g., with adhesive 106 in a conventional manner. Bond pads 108 are electrically connected to upper traces 110 by bond wires 112, e.g., by wirebonding in a conventional manner. For clarity, vias 116, 116G, lower traces 114, 114G, pads 118, 118G are not illustrated in FIGS. 3, 4 and 5 although it is understood that substrate 102 in accordance with this embodiment includes vias 116, 116G, lower traces 114, 114G, and pads 118, 110G.

Substrate 102 is placed in a lower, e.g., first, mold half 302 of a mold 300. More particularly, mold half 302 includes a pocket 304, which is sized to correspond in shape with substrate 102. Pocket 304 includes a lower, e.g., first, mold surface 305. Substrate 102 is placed within pocket 304, and rests on lower mold surface 305.

Figure 4:
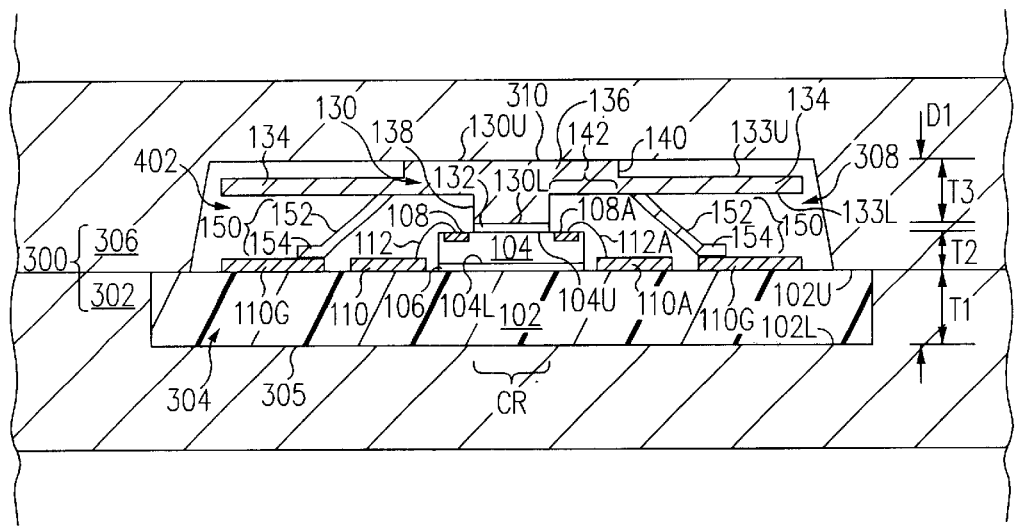
Figure 5:
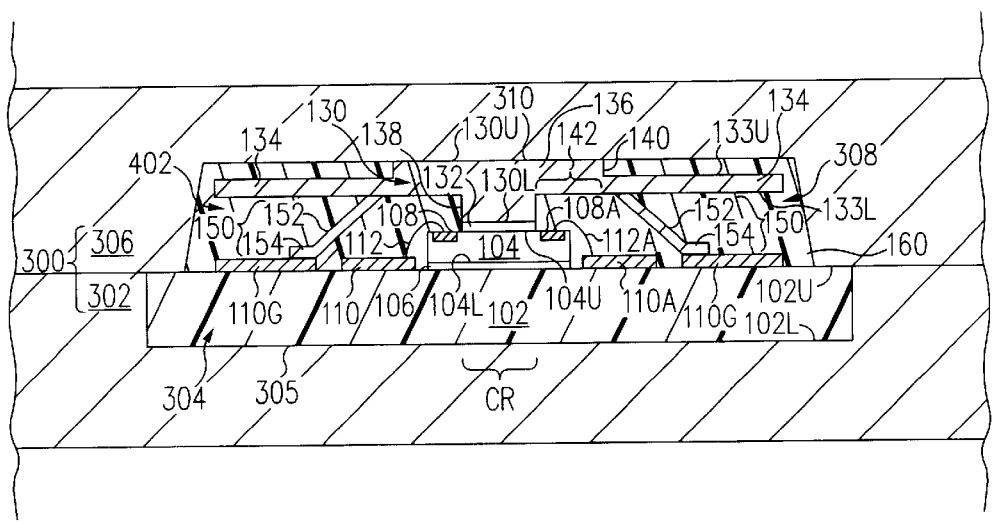

An upper, e.g., second, mold half 306 of mold 300 is above lower mold half 302. When upper mold half 306 is spaced apart from lower mold half 302 as illustrated FIG. 3, mold 300 is in an open state, sometimes called opened. In FIGS. 3, 4 and 5, well known mold features such as ejector pins are omitted for clarity although it is understood that mold 300 includes these other features depending upon the particular application.

Thermal pad 132 is mounted, e.g., adhesively, to lower surface 130L of heat sink 130. Alternatively, thermal pad 132 is mounted to upper surface 104U of electronic component 104 as indicated by the dashed lines. As yet another alternative, thermal pad 132 is not used.

Heat sink 130 is placed above electronic component 104 as shown in FIG. 3. More particularly, lower surface 130L of heat sink 130 is aligned with central region CR of upper surface 104U of electronic component 104.

Heat sink 130 is supported on substrate 102. More particularly, feet 154 of heat sink 130 rest on upper surface 102U of substrate 102. In this embodiment, feet 154 of heat sink 130 rest directly on upper ground traces 110G on upper surface 102U of substrate 102.

Heat sink 130 is in its relaxed state, i.e., is unstressed. In its relaxed state, an angle $\theta 1$ exists between legs 152 of spring elements 150 and projection ring 133 including projections 134.

Upper mold half 306 includes a pocket 308 sized to correspond with heat sink 130 to allow heat sink 130 to be fit within pocket 308 as described further below. Pocket 308 is defined by an upper, e.g., second, mold surface 310.

FIG. 4 is a cross-sectional view of package 100 at a further stage during fabrication in accordance with one embodiment of the present invention. Referring now to FIG. 4, mold 300 is in a closed state, sometimes called closed. When mold 300 is close, upper mold half 306 abuts lower mold half 302. Further, mold 300 defines a mold cavity 402, which is subsequently filled with encapsulant as is described further below. More particularly, mold cavity 402 is formed by pocket 308 of upper mold half 306 and upper surface 102U of substrate 102. When mold 300 is closed, substrate 102 is clamped in place thus preventing encapsulant from flowing under lower surface 102L of substrate 102.

Referring now to FIGS. 3 and 4 together, to close mold 300, upper mold half 306 is moved towards lower mold half 302 or vice versa. As upper mold half 306 is moved towards lower mold half 302, upper mold surface 310 of upper mold half 306 contacts upper surface 130U of heat sink 130. Upper mold half 306 continues to move towards lower mold half 302 after contacting upper surface 130U of heat sink 130. Upper mold half 306 forces and moves heat sink 130 towards substrate 102 and electronic component 104.

Spring elements 150 resist this motion of heat sink 130. More particularly, spring elements 150 are bent as heat sink 130 is moved towards substrate 102 such that the angle between legs 152 and projection ring 133 including projections 134 becomes less than angle $\theta 1$. This creates tensile force in spring elements 150.

As a result, spring elements 150 cause heat sink 130 to press upwards against upper mold half 306. More particularly, spring elements 150 cause upper surface 130U of heat sink 130 to press against upper mold surface 310 of upper mold half 306. Of importance, upper surface 130U of heat sink 130 is pressed against upper mold surface 310 of upper mold half 306 with sufficient force to prevent encapsulant from leaking between upper surface 130U and upper mold surface 310 during subsequent transfer of encapsulant into mold cavity 402 as described further below.

Advantageously, spring elements 150 press against upper surface 102U of substrate 102. Heat sink 130 is not pressed against electronic component 104. Of importance, substrate 102 has sufficient structural integrity to withstand this pressing by spring elements 150 without any damage or destruction to substrate 102.

As a further advantage, bending of spring elements 150 also presses feet 154 of spring elements 150 securely down on upper ground traces 110G. In this manner, spring elements 150 and, more generally, heat sink 130, is electrically connected to ground traces 110G. In one embodiment, feet 154 scrape slightly along ground traces 110G during closing of mold 300 thus enhancing the electrical connection of heat sink 130 to ground traces 110G.

Referring now to FIG. 4, after closing of mold 300, lower surface 130L of heat sink 130 is thermally connected to upper surface 104U of electronic component 104. To prevent heat sink 130 from crushing electronic component 104 during closing of mold 300, a distance D1 between lower mold surface 305 and upper mold surface 310 when mold 300 is closed is approximately equal to and slightly greater than the combined thickness T1, T2 and T3 of substrate 102, electronic component 104, and heat sink 130, respectively. Advantageously, thermal pad 132 is compliant and accommodates variations in thickness T1, T2 and T3. Of importance, heat sink 130 exerts little to no force on electronic component 104 preventing damage or destruction of electronic component 104.

FIG. 5 is a cross-sectional view of package 100 at a further stage during fabrication in accordance with one embodiment of the present invention. Referring now to FIG. 5, during encapsulation, heat sink 130, bond wires 112, electronic component 104 and upper surface 102U are encapsulated in encapsulant to form package body 160. More particularly, mold cavity 402 is filled, e.g., through mold runners (not shown) connected to mold cavity 402, with a fluid (heated) encapsulant, sometimes called molding compound, to form package body 160.

For example, fluid encapsulant is pressure fed by a transfer molding or injection molding process into mold cavity 402. Mold cavity 402 is filled using any one of a number of conventional techniques, e.g., top gate, bottom gate, gang pot and runners, or single shot. After mold cavity 402 is filled with the encapsulant and the encapsulant cools and solidifies to form package body 160, mold 300 is opened and package 100 (FIG. 1) is removed from mold 300. After removal from mold 300, interconnection balls 120, 120G (FIG. 2) are formed, if desired.

Advantageously, spring elements 150 press upper surface 130U of heat sink 130 against upper mold surface 310 of mold 300. This prevents the formation of flash on upper surface 130U of heat sink 130, i.e., prevents package body 160 from entirely enclosing heat sink 130. As discussed above, by only partially enclosing heat sink 130 within package body 160 such that upper surface 130U of heat sink 130 is exposed to the ambient environment, heat transfer from package 100 is maximized.

In an alternative embodiment (not shown), a thin layer of encapsulant, sometimes called flash or bleed, is formed on upper surface 130U of heat sink 130, i.e., package body 160 contacts upper surface 130U. However, the layer of encapsulant on upper surface 130U in accordance with this embodiment is sufficiently thin such that the thermal performance of package 100 is not unacceptably reduced.

Although the formation of a single package 100 is described above, in an alternative embodiment, a plurality of packages 100 are fabricated simultaneously in a similar manner.

This application is related to Glenn et al., co-filed and commonly assigned U.S. patent application Ser. No. 09/839,288, entitled "HEAT SPREADER WITH SPRING IC PACKAGE FABRICATION METHOD", which is herein incorporated by reference in its entirety.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:
1. An electronic component package comprising:
   a substrate comprising a first surface;
   an electronic component comprising a first surface coupled to said first surface of said substrate;
   a heat sink comprising:
      a first surface thermally connected to a second surface of said electronic component; and
      a first spring element supporting said heat sink on said first surface of said substrate; and
   a package body formed of electrically insulating encapsulant material encapsulating at least a portion of said heat sink and locking said heat sink in place.

2. The electronic component package of claim 1 wherein said heat sink further comprises a second surface exposed directly to an ambient environment.

3. The electronic component package of claim 2 wherein said second surface of said heat sink has a greater surface area than a surface area of said second surface of said electronic component.

4. The electronic component package of claim 1 further comprising a thermal pad between said second surface of said electronic component and said first surface of said heat sink.

5. The electronic component package of claim 1 wherein said first surface of said heat sink has a surface area less than a surface area of said second surface of said electronic component such that bond pads on said second surface of said electronic component are exposed.

6. The electronic component package of claim 5 wherein said heat sink further comprises:
   a ledge extending over said bond pads, said ledge being parallel to said first surface of said heat sink; and
   a first side extending between said ledge and said first surface of said heat sink.

7. The electronic component package of claim 1 wherein said first spring element comprises a leg and a foot.

8. The electronic component package of claim 7 wherein said heat sink further comprises:
   a central body portion comprising said first surface of said heat sink; and
   a projection projecting outwards from said central body portion, said projection supporting said first spring element.

9. The electronic component package of claim 8 wherein said first spring element is cut from said projection.

10. The electronic component package of claim 8 wherein a first end of said leg is coupled to said projection, a second end of said leg being coupled to said foot.

11. An electronic component package comprising:
   a substrate comprising a first surface;
   an electronic component comprising a first surface coupled to said first surface of said substrate;
   an electrically conductive trace coupled to said first surface of said substrate; and
   a heat sink comprising:
      a first surface thermally connected to a second surface of said electronic component; and
      a first spring element supporting said heat sink on said first surface of said substrate, wherein said first spring element comprises a leg and a foot, said foot being physically and electrically connected to said trace, and wherein said heat sink comprises an electrically conductive material.

12. The electronic component package of claim 11 wherein said heat sink shields said electronic component from external radiation.

13. A shielded electronic component package comprising:

a substrate comprising a first surface;

an electronic component comprising a first surface coupled to said first surface of said substrate, said electronic component further comprising a bond pad on a second surface of said electronic component; and a heat sink thermally connected to said second surface of said electronic component, said heat sink comprising a spring element physically and electrically coupled to a first trace coupled to said first surface of said substrate.

14. The shielded electronic component package of claim 13 further comprising:

a second trace coupled to said first surface of said substrate; and a bond wire electrically connecting said bond pad to said second trace.

15. The shielded electronic component package of claim 13 wherein said spring element comprises a leg and a foot, said foot being in physical and electrical contact with said first trace.

16. The shielded electronic component package of claim 13 wherein said heat sink comprises an electrically conductive material.

17. The shielded electronic component package of claim 13 further comprising:

a second trace coupled to a second surface of said substrate, wherein said first trace is electrically connected to said second trace.

18. The shielded electronic component package of claim 17 further comprising an interconnection ball electrically connected to said second trace, said heat sink being electrically connected to said interconnection ball.

19. An electronic component package comprising:

a substrate comprising an upper surface;

ground traces coupled to said upper surface of said substrate;

an electronic component comprising a lower surface coupled to said upper surface of said substrate, said electronic component further comprising an upper surface comprising a plurality of bond pads;

a heat sink thermally connected to a central region of said upper surface of said electronic component inward of said bond pads, said heat sink comprising spring elements supporting said heat sink on said upper surface of said substrate, said spring elements being physically and electrically connected to said ground traces.

20. An electronic component package comprising:

a substrate comprising an upper surface;

means for grounding coupled to said upper surface of said substrate;

an electronic component comprising a lower surface coupled to said upper surface of said substrate, said electronic component further comprising an upper surface comprising a plurality of bond pads; and means for dissipating heat thermally connected to a central region of said upper surface of said electronic component inward of said bond pads, said means for dissipating heat comprising means for supporting said means for dissipating heat on said upper surface of said substrate, said means for supporting being physically and electrically connected to said means for grounding.

21. The electronic component package of claim 20 wherein said means for dissipating heat shields said electronic component from radiation.

22. The electronic component package of claim 20 further comprising means for electrically connecting said means for grounding to a reference voltage source.

23. An electronic component package comprising:

a substrate comprising a first surface;

an electronic component comprising a first surface coupled to said first surface of said substrate; and a heat sink comprising:

a central body portion comprising a lower surface and an upper surface, said lower surface being coupled to a second surface of said electronic component;

a projection ring comprising a projection, said projection ring extending outwards from said central body portion, said projection ring being parallel to and located between planes defined by said lower surface and said upper surface; and a spring element supporting said heat sink on said first surface of said substrate, said spring element being supported by said projection, said spring element comprising a leg and a foot, a first end of said leg being coupled to said projection, a second end of said leg being coupled to said foot, wherein said heat sink comprises an electrically conductive material.

24. The electronic component package of claim 23 wherein said spring element is cut from said projection.

25. The electronic component package of claim 23 wherein said lower surface has a surface area less than a surface area of said upper surface.

26. The electronic component package of claim 23 wherein said central body portion further comprises:

a ledge parallel to said lower surface; and a lower side extending between said lower surface and said ledge, said lower side being perpendicular to said lower surface.

\* \* \* \* \*